(12) United States Patent
Inaba et al.

(10) Patent No.: US 7,098,675 B2
(45) Date of Patent: Aug. 29, 2006

(54) CAPACITANCE CHANGE DETECTION DEVICE

(75) Inventors: Hisashi Inaba, Kariya (JP); Kohei Kurachi, Nishio (JP); Rikuo Hatano, Toyota (JP)

(73) Assignee: Aisin Seiki Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 11/087,644

(22) Filed: Mar. 24, 2005

(65) Prior Publication Data

US 2005/0218913 A1    Oct. 6, 2005

(30) Foreign Application Priority Data

Mar. 30, 2004    (JP)    ............................. 2004-098667

(51) Int. Cl.
*G01R 27/26*    (2006.01)

(52) U.S. Cl. ...................................................... 324/678
(58) Field of Classification Search ................. 324/678
See application file for complete search history.

(56) References Cited

U.S. PATENT DOCUMENTS

| | | | |
|---|---|---|---|
| 5,343,157 A * | 8/1994 | Deschamps | 324/678 |
| 5,730,165 A * | 3/1998 | Philipp | 137/1 |
| 5,764,145 A | 6/1998 | Hansson et al. | |
| 6,194,903 B1 * | 2/2001 | Schulz | 324/661 |
| 6,466,036 B1 * | 10/2002 | Philipp | 324/678 |
| 2003/0061524 A1 * | 3/2003 | Casebolt et al. | 713/300 |
| 2004/0004488 A1 * | 1/2004 | Baxter | 324/678 |

FOREIGN PATENT DOCUMENTS

| | | | |
|---|---|---|---|
| EP | 1 341 306 A1 | | 9/2003 |
| WO | WO00/31553 | * | 6/2000 |
| WO | WO 00/31553 A1 | | 6/2000 |
| WO | WO 01/06472 A2 | | 1/2001 |
| WO | WO 03/021782 A1 | | 3/2003 |

* cited by examiner

*Primary Examiner*—Hezron Williams
*Assistant Examiner*—Ryan Christensen
(74) *Attorney, Agent, or Firm*—Sughrue Mion, PLLC

(57) ABSTRACT

A capacitance change detection device includes a sensor electrode, and an electrode capacitance measurement device for measuring capacitance of the sensor electrode on the basis of a correlation value based on a reference capacitance at every first predetermined time. A detection signal is generated when a current measurement value of capacitance is changed by equal to or greater predetermined threshold value than a measurement value obtained a second predetermined time before the current measurement value is measured. The capacitance change detection device further includes a sensitivity compensation capacitance for generating capacitance variations equivalent to specific variations of capacitance of the sensor electrode, and being switched between a connected state and a disconnected state. The threshold value is determined as a difference between measurement values of capacitance of the sensor electrode measured at the connected state and at the disconnected state. The threshold value is renewed at every third predetermined time.

5 Claims, 6 Drawing Sheets

CAPACITANCE CHANGE DETECTION DEVICE

CROSS REFERENCE TO RELATED APPLICATIONS

This application is based on and claims priority under 35 U.S.C. §119 with respect to Japanese Patent Application NO. 2004-4098667 filed on Mar. 30, 2004, the entire content of which is incorporated herein by reference.

FIELD OF THE INVENTION

The present invention relates to a capacitance change detection device for detecting a change of capacitance.

BACKGROUND

Capacitance change detection devices are used for detecting a trigger for opening operation (i.e., unlock operation) of systems for controlling opening and closing of a vehicle door for such as automobiles. More particularly, when a mode of a device provided at a vehicle is switched to an unlock allowance mode because a user approaches the vehicle and a code is identified between the device provided at the vehicle and a remote controller carried by the user, and when the user further touches an unlock sensor (i.e., an electrode) provided inside of an outside handle of the vehicle door, the device provided at the vehicle detects a change of capacitance of the electrode of the unlock sensor and carries out the unlock operation. That is, the capacitance change detection devices detect an intention of a user to unlock a vehicle door as an output of an unlock sensor (i.e., a change of capacitance).

A known capacitance change detection device which generates either an electric field or an electromagnetic field around an antenna by means of an electronic circuit and the antenna connected to the electronic circuit for detecting a very little change of capacitance on the basis of a change of either the electric field or the electromagnetic field around the antenna is described in U.S. Pat. No. 5,764,145. The known capacitance change detection device described in U.S. Pat. No. 5,764,145 is configured to avoid an influence of temperature and humidity upon a change of capacitance by passing a signal from an external electric field and an electromagnetic field received via an antenna through a highpass filter.

According to the known capacitance change detection device described in U.S. Pat. No. 5,764,145, a change of capacitance because of a change of temperature and a change of humidity are excluded from objects to be detected by providing a highpass filter. In other words, with the construction of the known capacitance change detection device described in U.S. Pat. No. 5,764,145, a sensitivity regarding variations is not changed.

In U.S. patent application Ser. No. 10/951883, the applicant provides another capacitance change detection device. According to the capacitance change detection device described in U.S. patent application Ser. No. 10/951883, by repeatedly charging a pre-discharged known reference capacitance by an unknown capacitance to be measured, and the number of charging until an electric voltage at both ends of the reference capacitance reaches a predetermined electric voltage is counted. When the number of charging is reduced by equal to or greater than a predetermined threshold value, it is detected as an increase of unknown capacitance to be measured.

Further, according to the capacitance change detection device described in U.S. patent application Ser. No. 10/951883, because capacitance to be measured is changed in accordance with a change of surrounding environment (e.g., capacitance at wire harness which is connected to the capacitance to be measured, or the like, is changed because of a change of an environment), the number of charging until the electric voltage at the both ends of the reference capacitance reaches the predetermined electric voltage is varied depending on the environment. Thus, when judgment of the number of charging is performed with the same threshold value at around different environments, the judgment results may be differed from each other even when variations of the capacitance to be measured is identical. In other words, there is a drawback that sensitivity regarding variations of capacitance to be measured depends on the environment.

A need thus exists for a capacitance change detection device which detects variations of capacitance to be measured on the basis of a change of a correlation value of capacitance to be measured which is measured on the basis of a reference capacitance.

SUMMARY OF THE INVENTION

In light of the foregoing, the present invention provides a capacitance change detection device, which includes a sensor electrode at which capacitance varies, and an electrode capacitance measurement means for measuring capacitance of the sensor electrode on the basis of a correlation value based on a predetermined reference capacitance at every first predetermined time. A detection signal is generated when a current measurement value of capacitance of the sensor electrode measured by the electrode capacitance measurement means is changed by an equal to or greater predetermined threshold value than a measurement value obtained a second predetermined time before a timing that the current measurement value is measured. The capacitance change detection device further includes a predetermined sensitivity compensation capacitance for generating capacitance variations equivalent to specific variations of capacitance of the sensor electrode generated by existence of a specific object at capacitance of the sensor electrode. The sensitivity compensation capacitance is configured to be switched between a connected state at which the sensitivity compensation capacitance is connected to the sensor electrode and a disconnected state at which the sensitivity compensation capacitance is disconnected from the sensor electrode. The threshold value is determined as a difference between a measurement value of capacitance of the sensor electrode measured by the electrode capacitance measurement means at the connected state and a measurement value of capacitance of the sensor electrode measured by the electrode capacitance measurement means at the disconnected state. The threshold value is configured to be renewed at every third predetermined time.

According to another aspect of the present invention, a capacitance change detection device includes a sensor electrode at which capacitance is varied, and an electrode capacitance measurement means for measuring capacitance of the sensor electrode on the basis of a correlation value based on a predetermined reference capacitance at every first predetermined time. A detection signal is generated when a current measurement value of capacitance of the sensor electrode measured by the electrode capacitance measurement means is changed by equal to or greater predetermined threshold value than a measurement value obtained a second predetermined time before a timing that the current measurement value is measured. The threshold value is determined as a value which is determined on the basis of the measurement value measured the second predetermined time before the time of the measurement.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

Embodiments of the present invention will be explained with reference to illustrations of drawing figures as follows.

Figure 1:
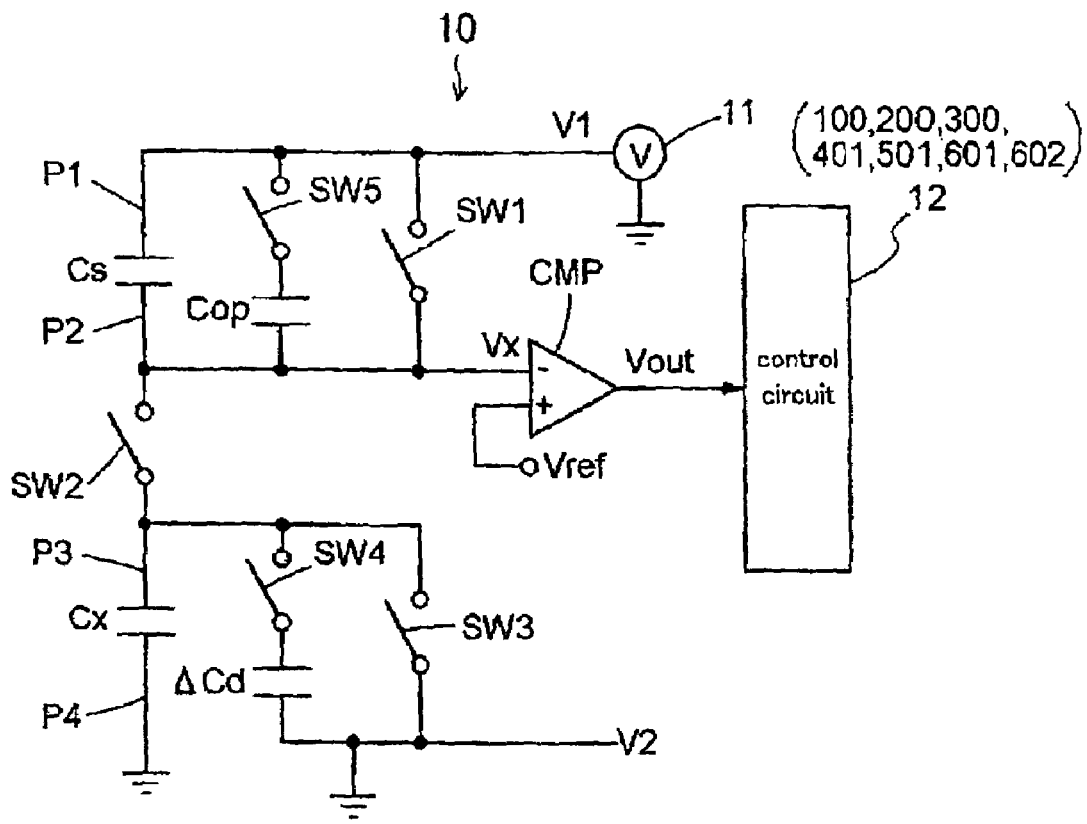
FIG. 1 shows a view of a circuit for a capacitance change detection device according to an embodiment of the present invention.

As shown in FIG. 1, a capacitance change measurement device (serving as a capacitance change detection device) includes a first opening and closing switch SW1 provided between ends P1, P2 of a reference capacitance Cs, a first electric potential source V1 connected to the first end P1 of the reference capacitance Cs, a second opening closing switch SW2 connecting the second end P2 of the reference capacitance Cs and a first end P3 of the sensor electrode capacitance Cx, a third opening and closing switch SW3 provided between the first end P3 and a second end P4 of the sensor electrode capacitance Cx, and a comparator CMP serving as an electric potential measurement means for measuring an electric potential Vx at the second end P2 of the reference capacitance Cs. The second end P4 of the sensor electric capacitance Cx is connected to a second electric potential source V2 and free air. In this case, the first electric potential source V1 corresponds to an output of a constant voltage circuit 11, the second electric potential source V2 is a ground, and the free air corresponds to an electric potential of low impedance equivalent to the ground. A reference electric voltage Vref is connected to a positive terminal of the comparator CMP, and the second end P2 of the reference capacitance Cs is connected to a first end of the comparator CMP.

The capacitance change measurement device further includes a control circuit 12 constructed by a microcomputer or hard logic circuit, or the like. An output signal Vout of the comparator CMP is inputted into the control circuit 12, and drive signals to the opening and closing switches SW1, SW2, SW3 are outputted from the control circuit 12 via lines.

Figure 2:
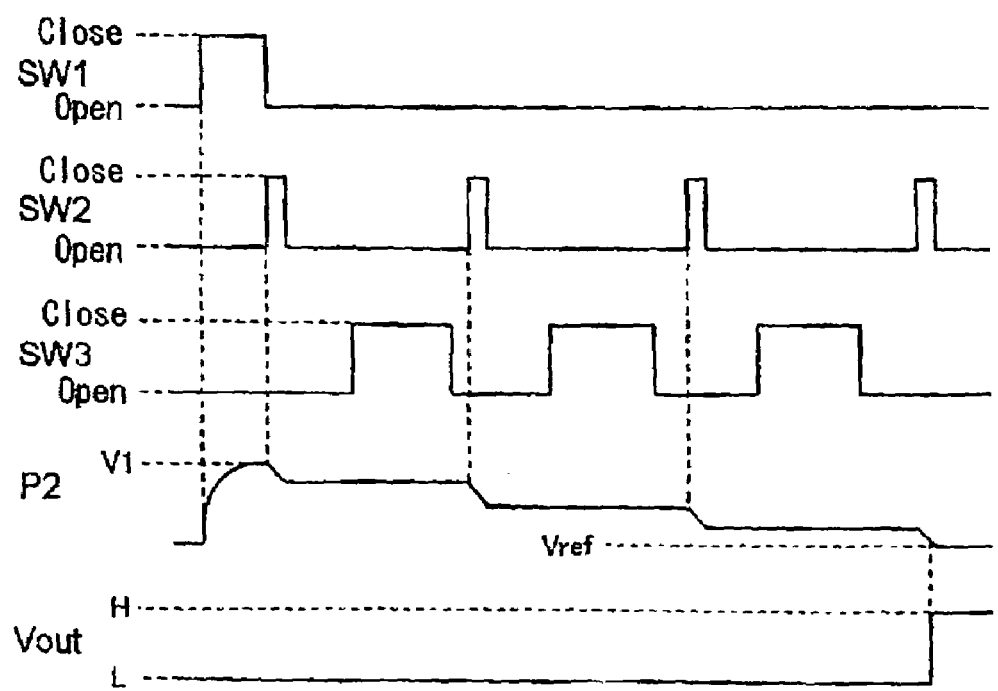
FIG. 2 is a waveform diagram of FIG. 1 according to the embodiment of the present invention.

The control circuit 12 includes a switch control means 100, a count means 200, and, a judgment means 300. As shown in FIG. 2, the switch control means 100 carries out switch control over the first through third opening and closing switches SW1, SW2, SW3, including a first switch operation for turning the first opening and closing switch SW1 to be a closed state (i.e., shown as high level H in FIG. 2) and returning to an open state (i.e., shown as low level L in FIG. 2), and repeating a second switch operation for turning the second opening and closing switch SW2 to be a closed state and returning to an open state, and a third switch operation for turning the third opening and closing switch SW3 to be a closed state and returning to an open state alternately. The count means 200 counts repeated number of the operation of the second switch SW2. The judgment means 300 judges variations ΔCx of the capacitance of the sensor electrode capacitance Cx on the basis of repeated number N of the operation of the second switch SW2 counted by the count means 200 until the electric potential Vx at the second end n of the reference capacitance Cs measured by the comparator CMP is changed by a predetermined potential from an initial electric potential V1 after the operation of the first switch SW1.

The electrode capacitance measurement means is realized as a part of the foregoing construction, and measurement value of the electrode capacitance measurement means serves as a count value N of the count means 200. In other words, the judgment means 300 judges the variations ΔCx of the capacitance of the sensor electrode capacitance Cx on the basis of the count value N of the electrode capacitance measurement means.

Figure 3:
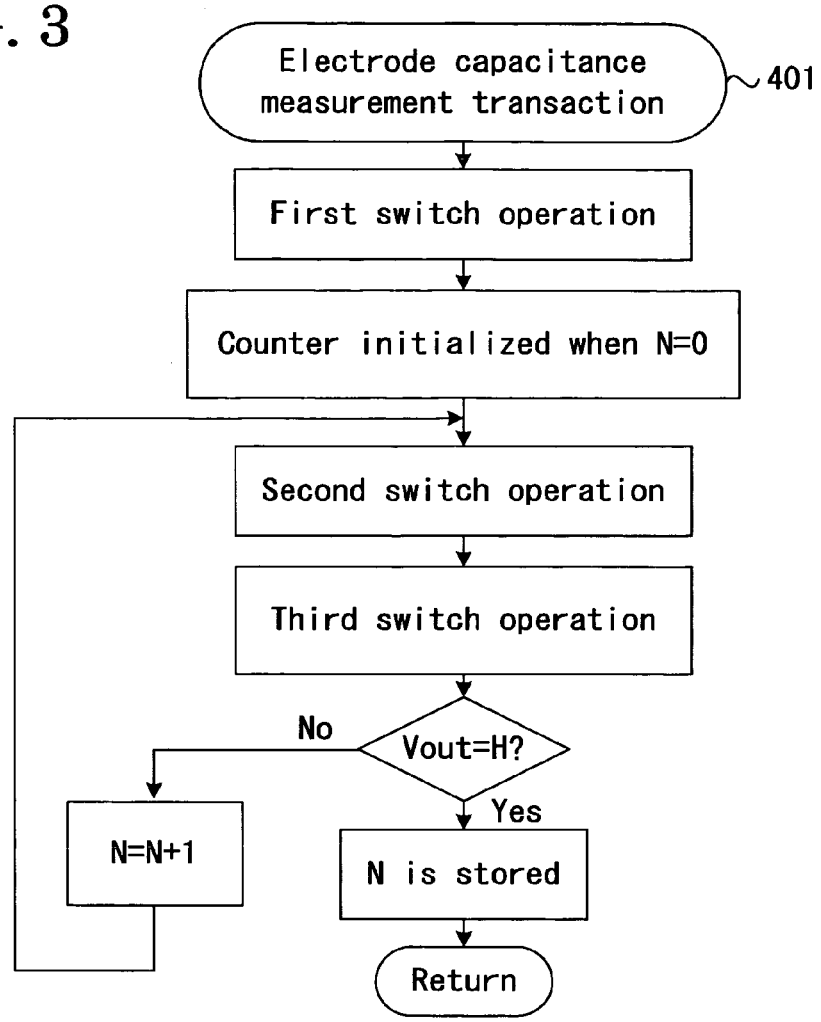
FIG. 3 is a flowchart of a capacitance measurement transaction according to the embodiment of the present invention.

In this case, because the initial electric potential of the second end P2 of the reference capacitance Cs corresponds to the electric potential at the electric potential source V1, and the reference electric voltage Vref is predetermined at a value smaller than the initial electric potential V1 by a predetermined potential amount (i.e., predetermined potential=V1 −Vref), the output signal Vout of the comparator CMP becomes low level L after the first switch operation. Thereafter, because the electric potential of the second end P2 of the reference capacitance Cs is declined by the predetermined potential (V1−Vref) from the initial electric potential V1 and the output signal of the comparator CMP is changed from low level L to high level H when the potential of the second end P2 of the reference capacitance Cs becomes below the reference electric voltage Vref by repeating the second and third switch operations, a count value of the count means 200 at a time that the output signal Vout of the comparator CMP is changed is maintained. The foregoing transaction performed by means of the electrode capacitance measurement means is controlled by an electrode capacitance measurement transaction 401 shown in FIG. 3.

A transaction shown in FIG. 2 is performed by the electrode measurement means at every predetermined time T1. The judgment means 300 maintains a count value N serving as a measurement value of the electrode capacitance measurement means at a time that the output signal Vout of the comparator CMP is changed from the low level L to the high level H, and judges that capacitance of the sensor electrode capacitance Cx is not changed when degree of the fluctuation |ΔN| is less than a predetermined threshold value Th in which detection error is considered and when a difference between the current count value N at the time that the output signal Vout of the comparator CMP is changed from the low level to the high level H and a count value at a predetermined number before, and judges that the capacitance of the sensor electrode capacitance Cx is changed when the degree of the fluctuation of the count value N |ΔN| is changed by equal to or greater than the predetermined threshold value Th. The control device 12 outputs a detected signal (i.e., detection signal) to an external device.

Figure 7:
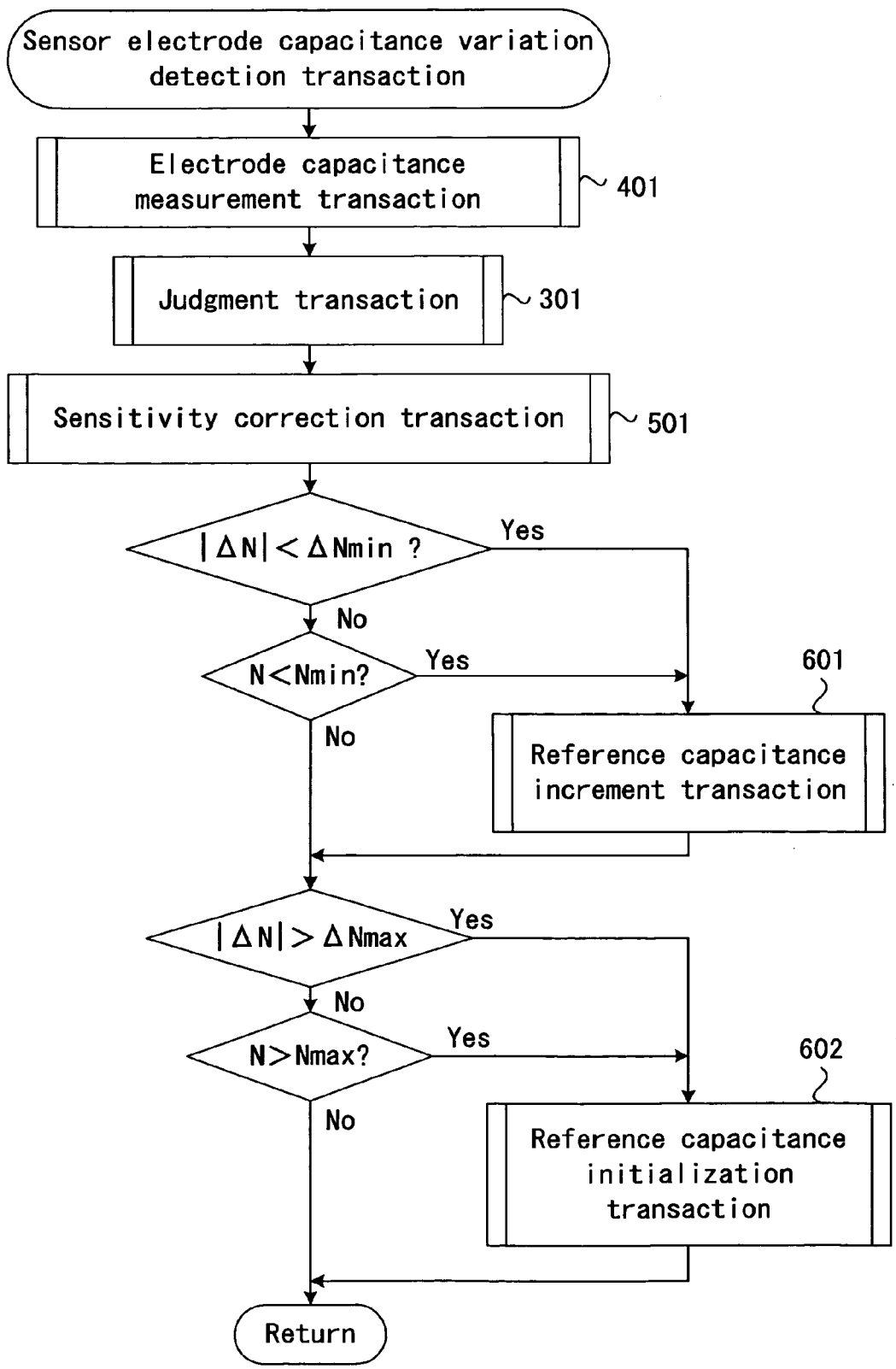
FIG. 7 is a flowchart of a sensor electrode capacitance change detection transaction according to the embodiment of the present invention.

Procedure processed at the sensor electrode capacitance change detection transaction carried out at every predetermined time T1 at the control circuit 12 will be explained with reference to a flowchart shown in FIG. 7. As shown in FIG. 7, because the electrode capacitance measurement transaction 401 carried out at the control circuit 12 is carried out at every sensor electrode capacitance change detection transaction, that is, at every predetermined time T1, the predetermined time T1 corresponds to a measurement cycle of the sensor electrode capacitance Cx and simultaneously corresponds to a judgment cycle of the capacitance variations ΔCx of the sensor electrode capacitance Cx.

Figure 4:
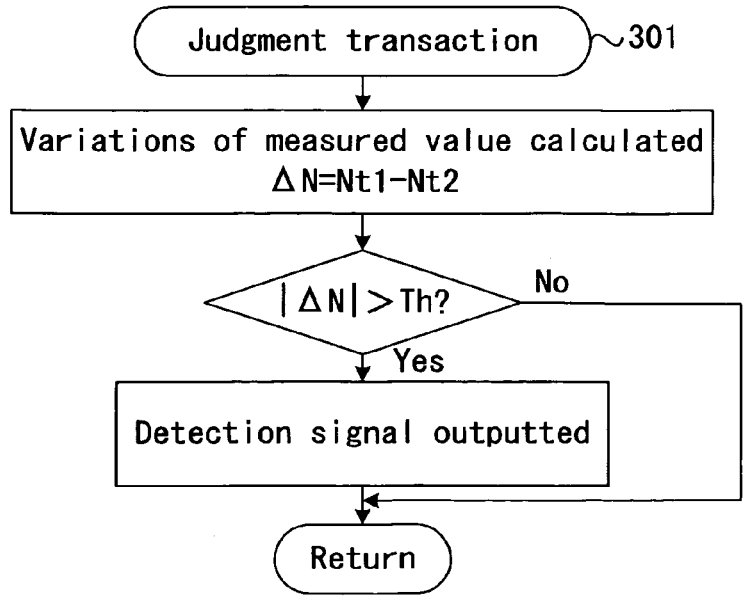
FIG. 4 is a flowchart for a judgment transaction according to the embodiment of the present invention.
Figure 5:
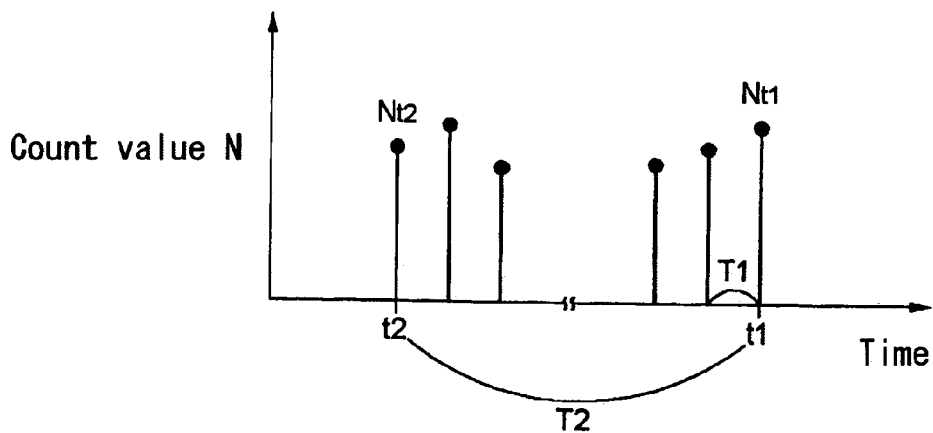
FIG. 5 is a view of a measurement result at every capacitance measurement cycle according to the embodiment of the present invention.

The electrode measurement transaction 401 is carried out at every predetermined measurement cycle T1, and a correlation value based on the reference capacitance Cs of the sensor electrode capacitance Cx, that is, the repeated number N of the second switch operation is measured by means of the electrode capacitance measurement means. The electrode capacitance variations ΔCx is judged on the basis of the fluctuation ΔN of the count value N by means of the judgment transaction 301 shown in FIG. 4. Because the fluctuation ΔN of the count value N corresponds to a difference between a count value $N_{t1}$ at a time of measure time t1 and a measurement value $N_{t2}$ at a time of t2 which is a predetermined time T2 before (i.e., $\Delta N = N_{t1} - N_{t2}$), a capacitance change by equal to or greater than the capacitance variations ΔCx which is generated within a time interval adequately shorter than a time interval during which the capacitance variations ΔCx is generated because of existence of a specific detection object can be excluded from an object of the detection. For example, sensor electrode capacitance generated because a user touches the sensor electrode is detected, but a change of the sensor electrode capacitance because raindrop is attached is not detected.

After carrying out a judgment transaction 301, a threshold value Th referred at the next judgment transaction 301 is renewed by a sensitivity correction transaction 501. Thereafter, when either one of the count value N or the fluctuation |ΔN| of the count value N is smaller than respective lower limit values Nmin, ΔNmin, a reference capacitance increment transaction 601 is carried out. When either the count value N or degree of fluctuation |ΔN| of the count value N based on the reference capacitance changed by the reference capacitance increment transaction 601 is greater than respective upper limit values Nmax, ΔNmax, a reference capacitance initialization transaction 602 for initializing the reference capacitance is carried out. A sensitivity correction means 500 and a reference capacitance change means 600 will be explained as follows.

The count value N serving as the measurement value of the electrode capacitance measurement means is changed in accordance with a sensor electrode capacitance Cx at the environment when the count value N is measured. By repeating the second switch operation, and the third switch operation, the electric potential Vx of the second end P2 of the reference capacitance Cs declines from the initial electric potential V1 in accordance with charging process of the reference capacitance Cs. Provided that the electric potential Vn at the second end P2 of the reference capacitance Cs at a time that the n-th second switch operation being completed is changed to the electric potential $V_{n+1}$ at a time that the n+1-th second switch operation is completed, the electric potential Vx at the second end P2 shows $V_{n+1}$ because of the electric charges after increment of electric charges newly charged at the n+1-th second switch operation which is added to the electric charges which has been charged at the reference capacitance Cs at a time of completion of the n-th second switch operation. Accordingly, the following formula (Formula 1) is established.

$$Cx \cdot V_{n+1} + Cs \cdot (V1 - Vn) = Cs \cdot (V1 - V_{n+1})$$

Obtaining a relationship between $V_{n+1}$ and Vn by transforming the Formula 1, Formula 2 is obtained as follows.

$$V_{n+1} = Vn \cdot Cs/(Cx + Cs)$$

Because the electric potential Vx of the second end P2 at a time that the first operation of the second switch operation is completed, that is, V1 is indicated as V1=V1·Cs/(Cx+Cs), according to Formula 2, the electric potential Vn of the second end P2 of the reference capacitance Cs at a time that the n-th second switch operation is completed is indicated as Formula 3 as follows.

$$Vn = V1 \cdot (Cs/(Cx + Cs))^n$$

Although, in a precise sense, leakage current generated at the sensor electrode capacitance Cx and stray capacitance which exists at lines lead to the sensor electrode have to be taken into account, according to Formula 3, at least Vn includes Cx/Cs as a factor. Further, according to Formula 3, a repeat of the second switch operation is proceeded, declining amount |Vn+1−Vn| of the electric potential per a single second switch operation of the electric potential Vx at the second end P2 of the reference capacitance Cs is gradually reduced.

Figure 8:
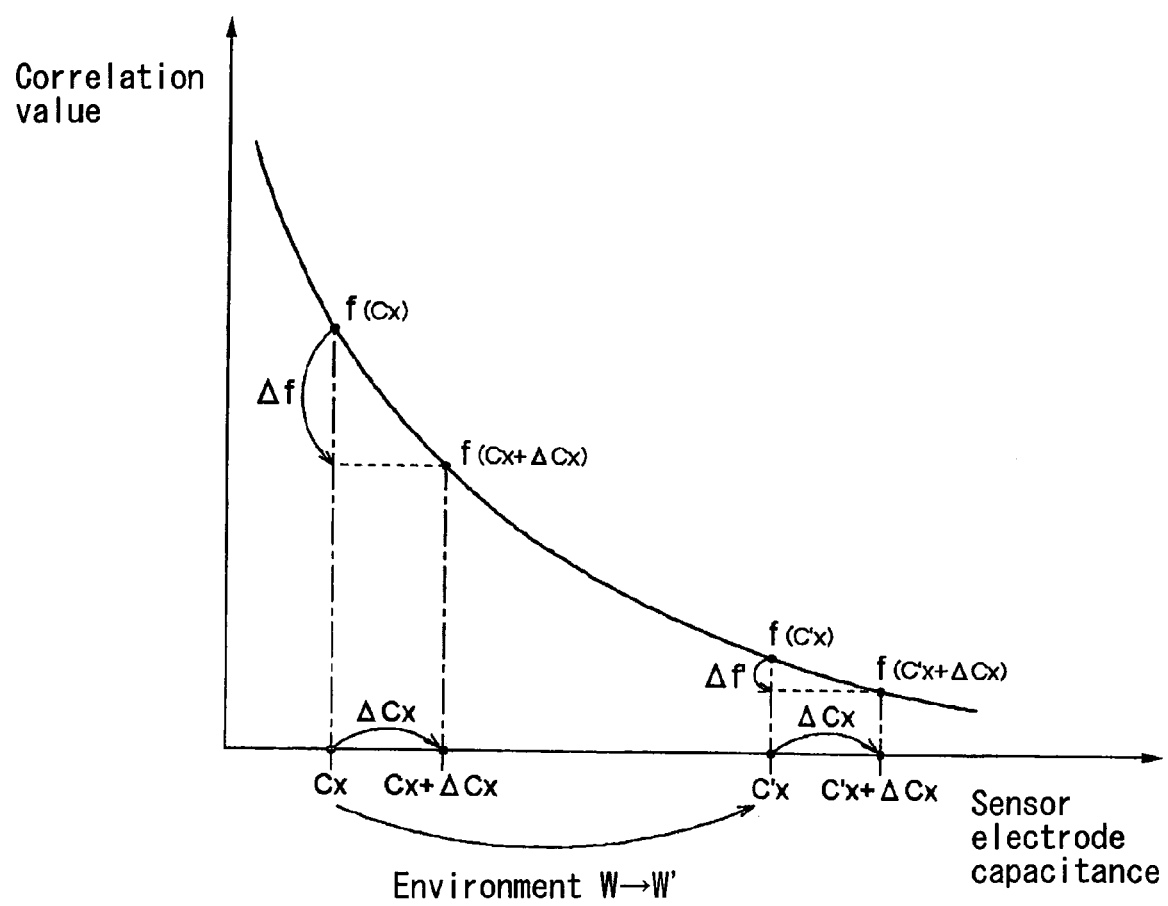
FIG. 8 is a view showing a change of electrode capacitance and a change of fluctuation of a correlation value in different environments according to the embodiment of the present invention.

The count value N of the count means 200 serving as the measurement value of the electrode capacitance measurement means corresponds to a value of n when Vn assumes below Vref for the first time, which means that Vn has Cx/Cs as a factor according to Formula 3. Accordingly, when the sensor electrode capacitance Cx is changed because of a change of an environment W, as shown in FIG. 8, values of N is changed even when the sensor electrode capacitance variations ΔCx are the same. Thus, judgment results may be different provided that the judgment means 300 judges measurement result of the electrode capacitance measurement means on the basis of the threshold value Th at both environments W, W' because a measurement value of a capacitance variation ΔCx is N under a certain environment W and a measurement value of a capacitance variation ΔCx is N' under another environment W'.

In order to securely detect capacitance variations ΔCx of the sensor electrode capacitance Cx' at the different environment W' even when the sensor electrode capacitance Cx is changed to the sensor electrode capacitance Cx' by the change of the environment W to the environment W', according to a capacitance change detection device 10, a threshold value Th which is referred to when judging a count value N of a sensor electrode capacitance Cx at the environment W at a time of measurement is corrected to an appropriate value by means of the sensitivity correction means 500 at every predetermined time T3. The sensitivity correction means 500 generates capacitance variation ΔCd, which is equivalent to capacitance change by existence of a specific detection object (e.g., a contact by a user), at a sensor capacitance Cx, and renews the degree of fluctuation

|ΔNd| of the measurement value N at that time as a threshold value Th which is referred by the judgment means 300.

Figure 6:
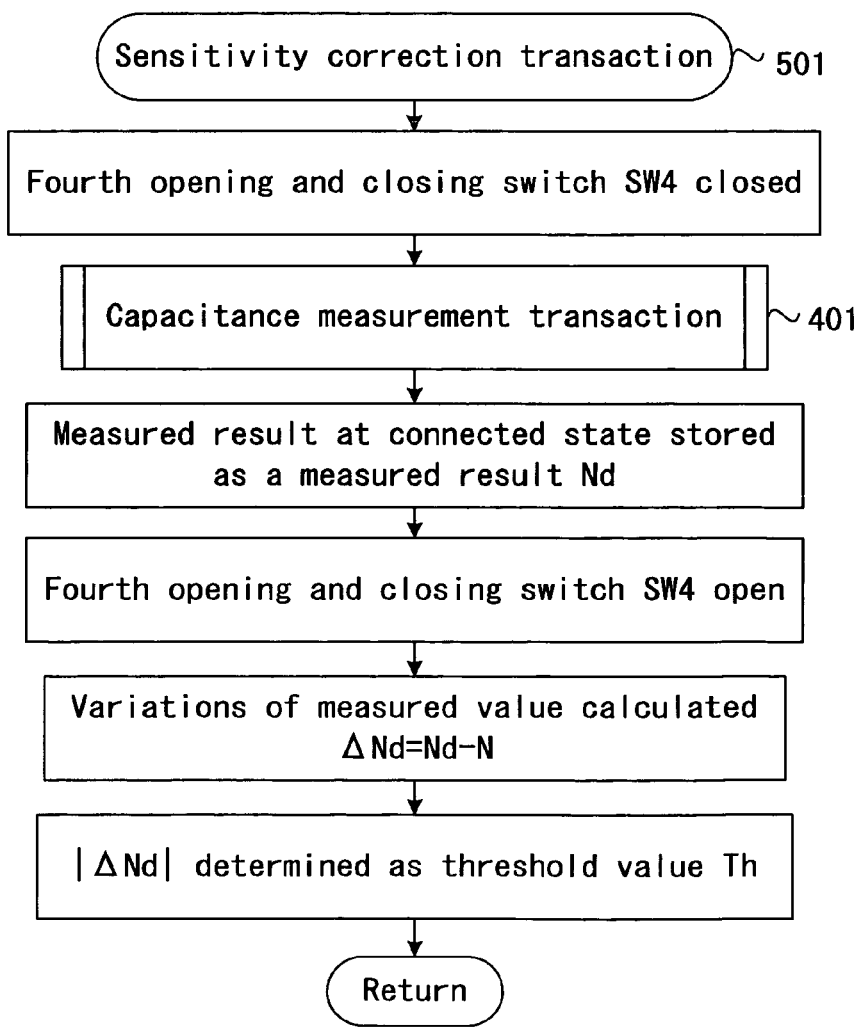
FIG. 6 is a flowchart of a sensitivity correction transaction according to the embodiment of the present invention.

The sensitivity correction means 500, as shown in FIG. 1, includes a sensitivity compensation capacitance ΔCd whose first end is connected to the second electric potential V2, a fourth opening and closing switch SW4 for connecting both ends of the sensitivity compensation capacitance ΔCd in parallel with the sensor electrode capacitance Cx, and the sensitivity correction transaction 501 carried out at the control circuit 12 (shown in FIG. 6).

As shown in FIG. 6, in a procedure of the sensitivity correction transaction 501, first, the fourth opening and closing switch SW4 is closed so that the sensitivity compensation capacitance ΔCd is connected in parallel to the sensor electrode capacitance Cx (connected state). Under this state, a sensor electrode capacitance (Cx+ΔCd) is measured by means of the electrode capacitance measurement means, and a measurement value Nd is stored. A difference |ΔNd| between the measurement value Nd and a result of count value N of the sensor electrode capacitance Cx at a state immediately before the sensitivity compensation capacitance ΔCd is connected in parallel to the sensor electrode capacitance Cx (not connected state) is determined as a new threshold value Th. Accordingly, a threshold value Th referred to at the next judgment is renewed.

Although, according to a flowchart shown in FIG. 7, a renewal cycle T3 of the threshold value Th by means of the sensitivity correction transaction 501 assumes the same cycle to the sensor electrode measurement cycle T1 because the sensitivity correction transaction 501 is carried out at every measurement of the sensor electrode capacitance carried out at every measurement cycle T1, the sensitivity correction transaction 501 may be carried out with less frequency, for example, once at every plural sensor electrode measurements. In this case, there is rare influence on the measurement value by a change of environment until a threshold value Th is changed by determining the cycle T3 for renewing the threshold value to be adequately short compared to a cycle of a change of the environment.

According to Formula 3, as shown in FIG. 8, there is occasion that a difference of a correlation value based on the reference capacitance Cs of the capacitance variations ΔCx becomes equal to or less than a predetermined value because of a change of the sensor electrode capacitance Cx due to an environment change. For example, when a difference |ΔN| between a measurement value of the sensor electrode capacitance Cx and Cx+ΔCx by the electrode capacitance measurement means at an environment W is 50, a difference |ΔN'| between a measurement value of the sensor electrode capacitance Cx' and Cx'+ΔCx' by the electrode capacitance measurement means at an environment W' may assume 10. In this case, although a threshold value Th at the environment W' is renewed by means of the sensitivity correction means 500, variations of counted number |ΔN| may or may not be detected on the basis of the threshold value Th when |ΔN| is very small, which is not favorable detection sensitivity.

Likewise, there is occasion that a value effective as a correlation value based on the reference capacitance Cs cannot be obtained because the sensor electrode capacitance Cx becomes too large because of the environment change. For example, when a measurement value N of a sensor electrode capacitance Cx at an environment W is 1000 (N=1000) and a measurement value of a sensor electrode capacitance Cx+ΔCx after a change of capacitance by existence of a detected object is 1050 (N=1050), a measurement value N' at an environment W' may become 300 (N=300) and a measurement value N' of Cx+ΔCx after a change of capacitance by a detected object may become 305 (N=305).

Foregoing drawbacks derive from increment of capacitance Cx, that is, because of increment of Cx, a capacitance variation ΔCx which is supposed to be detected assumes relatively small, low sensitive state. According to the embodiment of the present invention, in order to overcome the foregoing drawbacks, the reference capacitance change means 600 for changing a reference capacitance Cs for recovering the detection sensitivity is provided.

As shown in FIG. 1, the reference capacitance change means 600 includes a value-added reference capacitance Cop, a reference capacitance increment transaction 601 and a reference capacitance initialization transaction 602 carried out at the control circuit 12. A first end of the value-added reference capacitance Cop is connected the first electric potential source V1 via a fifth opening and closing switch SW5, and a second end of the value-added reference capacitance Cop is connected to the second end P2 of the reference capacitance Cs. The reference capacitance increment transaction 601 is carried out when either values of a measured value N of the electrode capacitance measurement means or a difference |ΔN| of measurement values N is smaller than respective lower limits Nmin, ΔNmin, at every sensor electrode measurement cycle T1 to close the fifth opening and closing switch SW5. When either a measurement value N or a difference |ΔN| of measurement values N based on a reference capacitance (Cs+Cop) after increment is greater than respective upper limit values Nmax, ΔNmax, the reference capacitance initialization transaction 602 for initializing a reference capacitance is carried out.

The reference capacitance increment transaction 601 closes the fifth opening and closing switch SW5 by means of a control signal of the control circuit 12, and an incremented reference capacitance state at which the value-added reference capacitance Cop is arranged to be connected in parallel to the reference capacitance Cs is emerged. The reference capacitance initialization transaction 602 opens the fourth opening and closing switch SW4 by means of a control signal of the control circuit 12 so that an initialized reference capacitance state at which the value-added reference capacitance Cop is not connected to the reference capacitance Cs is emerged.

In case the measurement value N of the sensor electrode capacitance Cx and the differences |ΔN| of the measurement values N becomes the foregoing state, the reference capacitance Cs indicated as Formula 3 increases by increasing the reference capacitance by connecting the value-added reference capacitance Cop to the reference capacitance Cs by means of the reference capacitance change means, effective count number N can be obtained when the sensor electrode capacitance Cx is measured and a difference |ΔN| of measurement values N obtained when the sensor electrode capacitance is changed from Cx to Cx+ΔCx because of existence of a detection object is judged by effective level of threshold value. Accordingly, detection sensitivity of the capacitance change detection device is stabilized.

According to a second embodiment of the present invention, the sensitivity correction means 500 may include a construction explained as follows. That is, the sensitivity correction means 500 according to the second embodiment of the present invention renews a threshold value Th by a value calculated on the basis of a measurement value N of the sensor electrode capacitance when a difference |ΔN| of measurement values is not detected. A measurement value N of the sensor electrode capacitance Cx measured at a certain environment W is indicated with a predetermined function depending on the reference capacitance Cs, according to Formula 3, as $N=h_{Cs}$ (Cx). Accordingly, the value of the sensor electrode capacitance Cx at the environment W is indicated as $Cx=h^{-1}{}_{Cs}$ (N) by a corresponding inverse function from the measurement value N. Thus, a measurement value $f_{Cs}$, (Cx+ΔCx) when Cx is changed to Cx+ΔCx assumes foreseeable. Accordingly, an appropriate threshold value Th can be determined in order to detect the capacitance variation equal to or greater than specific capacitance variations which is wanted to be detected. By renewing the value determined on the basis of the measurement value N in the foregoing manner, the judgment of the capacitance variation can be performed with an appropriate threshold value when the capacitance variation ΔCx is generated at the sensor electrode capacitance Cx at a time of the measurement.

When the threshold value Th is renewed at every predetermined time T3, a change of a measurement value can be judged with an appropriate threshold value Th by determining the predetermined time T3 to the degree that an influence by the environment can be disregarded. Further, a threshold values corresponding to measurement values classified into predetermined categories may be saved as a table, or the like, in a memory device in advance, and a threshold value may be renewed referring to the table at a time that a measurement value is obtained without a calculation transaction in order to obtain an appropriate threshold value Th.

According to the embodiment of the present invention, the capacitance variations of the sensor electrode is detected when the correlation value based on the reference capacitance is changed by equal to or greater than a predetermined threshold value within a second predetermined time. In an environment Wf, a correlation value obtained by measuring the sensor electrode capacitance Cx on the basis of the reference capacitance Cs by means of the electrode capacitance measurement means is indicated as $f_{Cs}$ (Cx). In this case, $f_{Cs}$ is a function of Cx and depends on the reference capacitance Cs. That is, when the sensor electrode capacitance Cx is varied by ΔCx to be C+ΔCx at the environment Wf, a measurement value by the electrode capacitance measurement means assumes $f_{Cs}$ (C+ΔCx). A difference Δf between correlation values of the sensor electrode capacitance Cx before and after the variations is indicated as $Δf=f_{Cs}$ (Cx+ΔCx)−$f_{Cs}$ (Cx). When the difference Δf between the correlation values with an interval of the second predetermined time is varied by equal to or greater than a threshold value Th, that is, when |Δf| is greater than the threshold value Th (i.e., |Δf|>Th), it is deemed that the capacitance of the sensor electrode is varied and a detection signal is outputted.

On the other hand, when the environment W is changed to be another environment W', as shown in FIG. 8, the sensor electrode capacitance Cx is changed to Cx', and a correlation value based on the reference capacitance Cs obtained by measurement by means of the electrode capacitance measurement means assumes $f_{Cs}$ (Cx'). A measurement value by the electrode capacitance measurement means when the sensor electrode capacitance is varied by the variations ΔCx of the capacitance, which is the same with the variations of the sensor electrode capacitance at the environment W, at the environment W' assumes $f_{Cs}$ (Cx'+ΔCx). Thus, a difference Δf' between correlation values of the sensor electrode capacitances Cx before and after the change when the sensor electrode capacitance is varied by ΔCx at the environment W is indicated as $Δf'=f_{Cs}$ (Cx'+ΔCx)−$f_{Cs}$ (Cx').

As foregoing, even when the capacitance variations ΔCx at the sensor electrode capacitance are the same, variations of the correlation values are different between Δf and Δf' (shown in FIG. 8) at the environments W, W' respectively. Accordingly, when variations of the correlation values are judged by a common threshold value Th, judgment results relative to the same capacitance variations ΔCx may be differed depending on the environments. In other words, the judgment result depends on the environments. However, with the construction of the embodiment of the present invention, by renewing the threshold value Th using the sensitivity compensation capacitance, the judgment result is unlikely to be dependent on the environments.

The sensitivity compensation capacitance is for generating variations ΔCd at the sensor electrode capacitance equivalent to variations of the sensor electrode capacitance generated by existence of a specific detection object. The sensor electrode capacitance is measured by a correlation value on the basis of the reference capacitance Cs by means of the electrode capacitance measurement means at a connected state at which the sensitivity measurement means is connected to the sensor electrode and a disconnected state at which the sensitivity compensation capacitance is not connected to the sensor electrode. Because a difference of measurement values between the connected state and the disconnected state is determined as a new threshold value for judging the change of the sensor electrode capacitance, and the threshold value is renewed at every third predetermined time, variations of the correlation value by the capacitance variation ΔCx of the sensor electrode can be judged with a difference of correlation values obtained by capacitance variations ΔCd equivalent to the capacitance variation at an environment approximate to an environment when a measurement is performed.

Thus, by determining a difference between measurement values at the connected state at which the sensitivity compensation capacitance is connected to the sensor electrode and at the disconnected state at which the sensitivity compensation capacitance is disconnected from the sensor electrode as a threshold value, and by renewing the threshold value at every third predetermined time, a detection sensitivity when detecting variations of the sensor electrode capacitance assumes unlikely to be dependent on an environment.

Accordingly, the capacitance change detection device according to the embodiment of the present invention detects variations of capacitance to be measured on the basis of variations of correlation value of the capacitance to be measured on the basis of the reference capacitance with less fluctuation of the sensitivity in different surrounding environments.

According to the embodiment of the present invention, variations of correlation value by the capacitance variations ΔCx of the sensor electrode capacitance is indicated as $f_{Cs}$ (Cx+ΔCx)−$f_{Cs}$ (Cx) when the sensor electrode capacitance Cx is measured by a correlation value $f_{Cs}$ (Cx) based on the reference capacitance Cs and the capacitance variations ΔCx of the sensor electrode is judged by variations of a correlation value based on the reference capacitance Cs. Correlations between the sensor electrode capacitance Cx and the reference capacitance Cs at the environment Wf is determined when a measurement value of the sensor electrode capacitance Cx is obtained as a correlation value $f_{Cs}$ (Cx). That is, a function $f_{Cs}$ is determined uniquely. Accordingly, the correlation value $f_{Cs}$ (Cx+ΔCt) when capacitance variation ΔCt at the sensor electrode is generated by existence of a specific object at an environment when measuring sensor electrode becomes foreseeable. As foregoing, because the correlation value $f_{Cs}$ (Cx+ΔCt) of the sensor electrode capacitance (Cx+ΔCt) after a change of the capacitance by the specific detection object is foreseeable, variations of a correlation value assumes foreseeable. Thus, according to the embodiment of the present invention, by determining the threshold value on the basis of variations which is foreseeable from the correlation value measured at every first predetermined time, variations from the correlation value before the second predetermined time can be judged by a threshold value on the basis of correlation at an environment before the second predetermined time. Accordingly, detection sensitivity can follow a transition of measurement time, and fluctuation of the detection sensitivity can be restrained.

As foregoing, the capacitance change detection device according to the embodiment of the present invention can detect variations of the capacitance to be measured by a change of correlation value of the capacitance-to-be-measured measured on the basis of the reference capacitance with less fluctuation of the sensitivity at different surrounding environments.

According to the embodiment of the present invention, at the first switch operation, an electric charge of the reference capacitance Cs, the first ends thereof being connected to the first electric potential V1, is discharged by closing the first opening and closing switch SW1 to make the electric potential Vx at the second end of the reference capacitance Cs be an initial electric potential V1 equivalent to the electric potential of the first electric potential V1. Thereafter, the second switch operation and the third switch operation are repeated alternately (i.e., either the second switch operation or the third switch operation is performed first). At the second switch operation, by closing the second opening and closing switch SW2, the reference capacitance Cs and the sensor electrode capacitance Cx are connected in series to impose a potential difference (V1–V2) between the first electric potential V1 and the second electric potential V2 or between the first electric potential V1 and the free air, and thus to simultaneously charge the reference capacitance Cs and the sensor electrode capacitance Cx. By the charging, charging voltage between the first and second ends of the reference capacitance Cs is incremented by electric voltage in accordance with capacitance ratio between the sensor electrode capacitance Cx and the reference capacitance Cs, and the electric potential at the second end of the reference capacitance Cs is changed from the initial electric potential V1. At the third switch operation, charged electric charge of the sensor electrode capacitance Cx is discharged by closing the third opening and closing switch SW3. Thereafter, by repeating the second switch operation and the third switch operation, the charged electric charge between the first and the second ends of the reference capacitance is gradually incremented (i.e., amount of increment is gradually reduced), and the electric potential Vx at the second end of the reference capacitance Cs is gradually reduced from the initial electric potential. Thus, the number of a repeat of the second switch operation when the electric potential Vx at the second end of the reference capacitance Cs reaches the predetermined electric potential Vref is obtained.

In this case, by performing the transaction for obtaining the number N of the second switch operation until the electric potential at the second end of the reference capacitance Cs varies by a predetermined electric potential (V1–Vref) from the initial electric potential by a series of first through third switch operations at every first predetermined time, when the sensor electrode capacitance Cx is not changed around the interval of the first predetermined time the number N of the repeat of the second switch operation is not supposed to be changed, and when the sensor electrode capacitance Cx is changed, the number N of the repeat of the second switch operation is changed. Accordingly, it is judged that the sensor electrode capacitance Cx is changed when the repeat of the number N is changed, and that the sensor electrode capacitance Cx is changed when the repeat of the number N is varied by equal to or greater than a threshold value Th.

An electric potential at the first end of the reference capacitance Cs serving as a reference for measuring an electric potential at the second end of the reference capacitance Cs is stabled because it is connected to the first electric potential V1. Further, because the second end of the reference capacitance Cs is connected to the sensor electrode capacitance Cx only during the charging by the second switch operation and the second end of the reference capacitance Cs assumes high impedance state by being disconnected from the sensor electrode capacitance Cx during measuring the electric potential, an appropriate electric potential can be measured by using an amplifier serving as the electric potential measurement means, for example, an operational amplifier and comparator, or the like, with which high impedance can be easily inputted.

Accordingly, the sensor electrode capacitance Cx is measured as the repeat number N of the second switch operation until the charging voltage of the reference capacitance Cs reaches a predetermined value. That is, the sensor electrode capacitance Cx is measured as a correlation value $f_{Cs}$ (Cx) based on the reference capacitance Cs.

When the correlation value $f_{Cs}$ (Cx) of the sensor electrode capacitance Cx based on the reference capacitance Cs is measured as the number N of the second switch operation, the correlation value $f_{Cs}$ (Cx) corresponds to discontinuous integer. Thus, even when the sensor electrode capacitance Cx is changed by the existence of specific detection object to be Cx+ΔCx, measured number of the second switch operation may indicate the same value with the value which is before the change of the sensor electrode capacitance. Further, as a result of increase of the sensor electrode capacitance Cx due to the change of the environment, variations ΔCx of the sensor electrode capacitance may become relatively small, variations of the correlation value assumes very little, and judgment with effective threshold value may not be performed.

Figure 9:
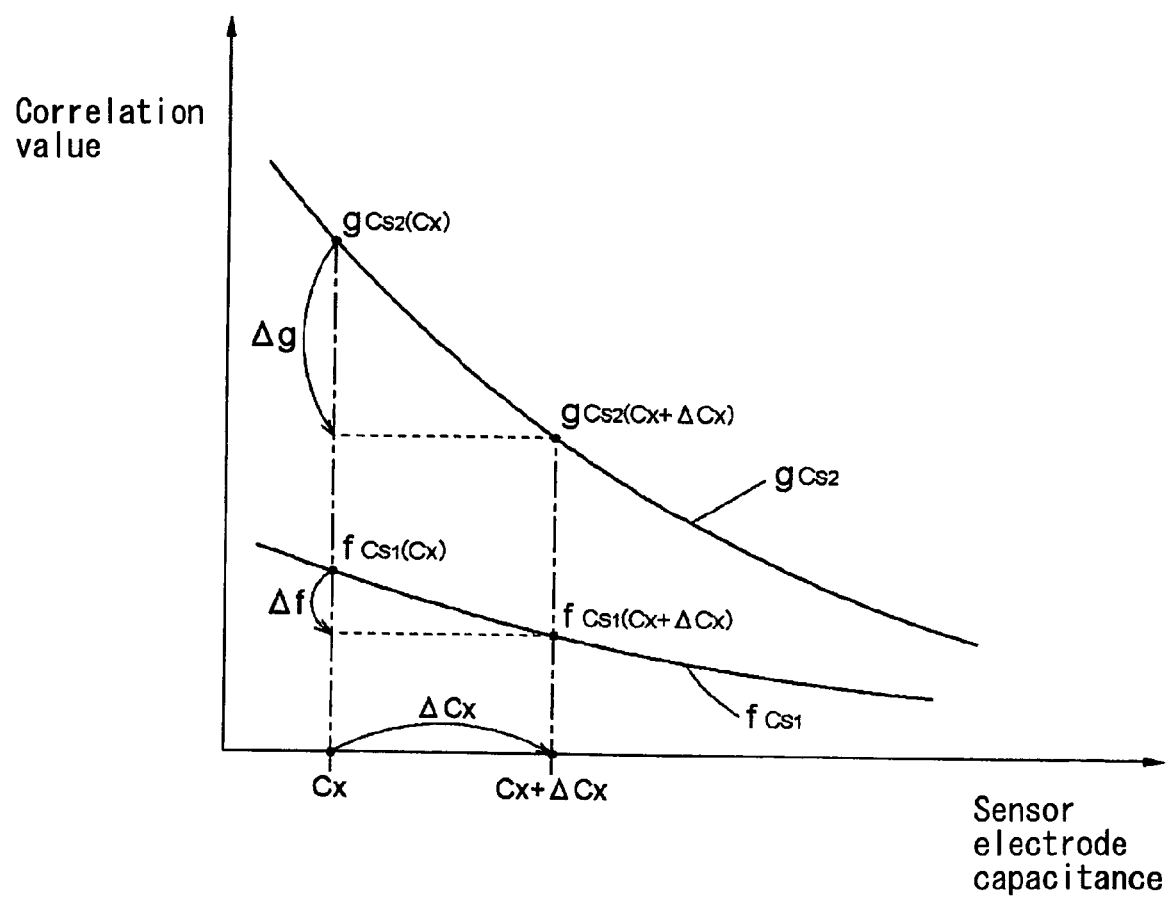
FIG. 9 is a view showing a fluctuation of a correlation value by a change of electrode capacitance on the basis of difference reference capacitances.

Because a correlation function $f_{Cs}$ is a function which depends on the reference capacitance Cs, when the reference capacitance Cs is changed from Cs1 to Cs2 by means of the reference capacitance change means, as shown in FIG. 9, a correlation function $f_{Cs}1$ can be changed to $g_{Cs}2$. Accordingly, variations $f_{Cs}1$ (Cx+ΔCx)–$f_{Cs}1$ (Cx) of the correlation value when the sensor electrode capacitance Cx is changed to Cx+ΔCx by existence of the specific detection object can be changed to $g_{Cs}2$ (Cx+ΔCx)–$g_{Cs}2$ (Cx) (i.e., change from Δf to Δg of FIG. 9). Thus, when variations of a correlation value is too little to perform judgment with effective threshold, or when a correlation value per se is not a value with effective level, by changing a correlation function to increment variations of the correlation value by the variations ΔCx of the sensor electrode capacitance, judgment of the capacitance variation ΔCx can be performed under the effective threshold value. Accordingly, the decline of the sensitivity for the judgment of the capacitance variation of the sensor electrode capacitance Cx can be prevented.

As foregoing, with the construction of the capacitance change detection device according to the embodiment of the present invention, the sensitivity regarding variations of the capacitance to be measured is maintained at favorable state when the capacitance variations of the capacitance to be measured is detected in accordance with the change of the correlation value of the capacitance to be measured on the basis of the reference capacitance.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A capacitance change detection device comprising:
a sensor electrode at which capacitance varies;
an electrode capacitance measurement means fix measuring capacitance of the sensor electrode on the basis of a correlation value based on a predetermined reference capacitance at every first predetermined time, wherein
a detection signal is generated when a current measurement value of capacitance of the sensor electrode measured by the electrode capacitance measurement means is changed equal to or greater than a predetermined threshold value in comparison to a measurement value obtained a second predetermined Lime before a timing that the current measurement value is measured;
a predetermined sensitivity compensation capacitance for generating capacitance variations equivalent to a specific variations of capacitance of the sensor electrode generated by existence of a specific object at capacitance of the sensor electrode, wherein
the sensitivity compensation capacitance is configured to he switched between a connected state at which the sensitivity compensation capacitance is connected to the sensor electrode and a disconnected state at which the sensitivity compensation capacitance is disconnected from the sensor electrode, and wherein
the threshold value is determined as a difference between a measurement value of capacitance of the sensor electrode measured by the electrode capacitance measurement means at the connected state and a measurement value of capacitance of the sensor electrode measured by the electrode capacitance measurement means at the disconnected state, and the threshold value is configured to he renewed at every third predetermined time.

2. A capacitance change detection device comprising:
a sensor electrode at which capacitance is varied; and
an electrode capacitance measurement means for measuring capacitance of the sensor electrode on the basis of a correlation value based on a predetermined reference capacitance at every first predetermined time, wherein
a detection Signal is generated when a current measurement value of capacitance of the sensor electrode measured by the electrode capacitance measurement means is changed equal to or greater than a predetermined threshold value in comparison to a measurement value obtained a second predetermined time before a timing that the current measurement value is measured, wherein
the threshold value is determined based on a predetermined function, $f_{Cs}(C_X)$, which is based on the predetermined reference capacitance, and is determined on the basis of the current measurement and the measurement value measured the second predetermined time before the time of the current measurement, and wherein
$Cx$ is the capacitance of the sensor electrode.

3. The capacitance change detection device according to claim 1, further comprising:
a first opening and closing switch provided between first and second ends of the reference capacitance;
a first electric potential source connected to the first cad of the reference capacitance;
a second opening and closing switch configured to connect the second end of the reference capacitance and a first end of the sensor electrode;
a third opening and closing switch provided between the first and second ends of the sensor electrode, the second end of the sensor electrode being connected to a second electric potential or free air;
an electric potential measurement means for measuring electric potential at the second end of the reference capacitance;
a switch control means for carrying out a switch control for repeating a second switch operation at which the second opening and closing switch being turned to be a closed state and returned to an open state and a third switch operation at which the third opening and closing switch being turned to be a closed state and returned to an open state alternately after performing a first switch operation at which the first opening and closing switch being turned to be a closed state and returned to an open state;
a count means for counting the number of a repeat of the second switch operation; the electrode capacitance measurement means including tho electric potential measurement means, the switch control means, and the count means; wherein the electrode measurement means measures the number of the repeat of the second switch operation, as the correlation value, counted by the count means until an electric potential at the second end of the reference capacitance measured by the electric potential measurement means is varied by a predetermined potential from an initial potential after the first switch operation; and
a reference capacitance change means for changing the reference capacitance.

4. The capacitance change detection device according to claim 2, further comprising: a first opening and closing switch provided between first and second ends of the reference capacitance;
a first electric potential source connected to the first end of the reference capacitance;
a second opening and closing switch configured to connect the second end of the reference capacitance and a first end of the sensor electrode;
a third opening and closing switch provided between the first and second ends of the sensor electrode, the second end of the sensor electrode being connected to a second electric potential or free air;
an electric potential measurement means far measuring electric potential at the second end of the reference capacitance;
a switch control means for carrying out a switch control for repeating a second switch operation at which the second opening and closing switch being turned to be a closed state and returned to an open state and a third switch operation at which the third opening and closing switch being turned to be a closed state and returned to an open stare alternately after performing a first switch operation at which the first opening and closing switch being turned to be a closed state and returned to an open state;

a count means for counting the number of a repeat of the second switch operation; the electrode capacitance measurement means including the electric potential measurement means, the switch control means, and the count means; wherein the electrode measurement means measures the number of the repeat of the second switch operation, as the correlation value, counted by the count means until an electric potential at the second end of the reference capacitance measured by the electric potential measurement means is varied by a predetermined potential from an initial potential after the first switch operation; and a reference capacitance change means for changing the reference capacitance.

5. A capacitance change detection device comprising:

a sensor electrode at which capacitance is varied;

an electrode capacitance measurement means for measuring capacitance of the sensor electrode on the basis of a correlation value based on a predetermined reference capacitance at every first predetermined time;

a first opening and closing switch provided between first and second ends of the reference capacitance;

a first electric potential source connected to the first end of the reference capacitance;

a second opening and closing switch configured to connect the second end of the reference capacitance and a first end of the sensor electrode;

a third opening and closing switch provided between the first and second ends of the sensor electrode, the second end of the sensor electrode being connected to a second electric potential or free air;

an electric potential measurement means for measuring electric potential at the second end of the reference capacitance;

a switch control means for carrying out a switch control for repeating a second switch operation at which the second opening and closing switch being turned to be a closed state and returned to an open state and a third switch operation at which the third opening and closing switch being turned to be a closed state and returned to an open state alternately after performing a first switch operation at which the first opening and closing switch being turned to be a closed state and returned to an open state;

a count means for counting the number of a repeat of the second switch operation; the electrode capacitance measurement means including the electric potential measurement means, the switch control means, and the count means; wherein the electrode measurement means measures the number of the repeat of the second switch operation, as the correlation value, counted by the count means until an electric potential at the second end of the reference capacitance measured by the electric potential measurement means is varied by a predetermined potential from an initial potential afar the first switch operation; and a reference capacitance change means for changing the reference capacitance, wherein a detection signal is generated when a current measurement value of capacitance of the sensor electrode measured by the electrode capacitance measurement means is changed equal to or greater than a predetermined threshold value in comparison to a measurement value obtained a second predetermined dine before a timing that the current measurement value is measured, and wherein the threshold value is determined as a value which is determined on the basis of the measurement value measured the second predetermined time before the time of the measurement.

* * * * *